(12) United States Patent
Zheng et al.

(10) Patent No.: US 6,686,791 B2
(45) Date of Patent: Feb. 3, 2004

(54) OXIDE ANTI-FUSE STRUCTURE UTILIZING HIGH VOLTAGE TRANSISTORS

(75) Inventors: Bo Zheng, Beaverton, OR (US); Wenllang Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 10/131,141

(22) Filed: Apr. 25, 2002

(65) Prior Publication Data

US 2003/0201819 A1 Oct. 30, 2003

(51) Int. Cl.[7] .............................................. H01H 37/76
(52) U.S. Cl. ....................................................... 327/525
(58) Field of Search ................................. 327/524, 525, 327/526

(56) References Cited

U.S. PATENT DOCUMENTS 5,838,189 A * 11/1998 Jeon ............................ 327/537
6,163,488 A * 12/2000 Tanizaki et al. ............. 365/200

* cited by examiner

*Primary Examiner*—Jeffrey Zweizig
(74) *Attorney, Agent, or Firm*—Antonelli, Terry, Stout & Kraus, LLP (57) ABSTRACT

An oxide anti-fuse structure is provided with vertical-drain NMOS transistors and vertical-source-drain NMOS transistors to obtain higher area density and low programming current requirement.

37 Claims, 7 Drawing Sheets

OXIDE ANTI-FUSE STRUCTURE UTILIZING HIGH VOLTAGE TRANSISTORS

FIELD

The present invention is directed to fuse structures included within semiconductor devices. More particularly, the present invention is directed to an oxide anti-fuse structure utilizing high voltage transistors with high area density and low programming current requirement.

BACKGROUND

Most semiconductor integrated circuit ("IC") devices now in use are generally fabricated in what is called CMOS (Complementary Metal Oxide Semiconductor) technology, which forms both PMOS and NMOS transistors in a silicon substrate. The objective of IC technology is to minimize transistor size and increase the density of core transistors in IC devices.

Examples of semiconductor IC devices include programmable read-only memory (PROM) devices, programmable logic arrays (PLA), and other types of memory arrays, such as dynamic random access memory (DRAM), static random access memory (SRAM), video random access memory (VRAM) and erasable programmable read-only memory (EPROM). These IC devices are typically designed with a number of redundant component elements that may be used to replace defective components in order to provide a fully functional circuit. These redundant components may be individual memory rows, memory columns or even individual memory cells in a particular row and column. In addition, one or more fuses may be used, in conjunction with other circuit elements, to control various circuit parameters (i.e. a digital value, a voltage, a current etc.). In general, a fuse operates in one of two states (programmed or un-programmed), namely a "closed" (i.e. low resistance) state, and an "open" (i.e. high resistance) state, in order to isolate the defective component and to selectively connect the redundant component in place of the defective component. In addition, such fuses may also be used to store process information of the IC devices (i.e., chip identification) for subsequent use to identify the IC devices.

A variety of fuses have been used in IC devices. For example, one fuse structure is formed by the so-called "Zener zap" method. Another example fuse structure is a metal link formed of tungsten. However, metal link fuses require large programming currents and are not viable for use with IC devices formed using newer process technologies.

A more recent fuse structure is the poly fuse ("polysilicon" or "poly resistor" fuse). One advantage of the poly fuse over the metal link fuse is the lesser amount of current required to open the fuse element during programming. However, poly fuses exhibit a pre-burned resistance of 30–100 ohms and a post-burned resistance ranging from a few hundreds to thousands ohms. In addition, poly fuses exhibit a low area density due to a large programming current needed to activate transistors and burn (or blow) the fuse elements after packaged in the IC devices.

Therefore, a need exists for a new fuse structure for implementation within IC devices formed using standard CMOS processes that has a higher area density and requires a much smaller programming current when compared to poly fuses.

BRIEF DESCRIPTION OF THE DRAWING(S)

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. As manufacturing techniques (e.g., photolithography) mature over time, it is expected that devices of smaller size could be manufactured. With regard to description of any timing or programming signals, the terms assertion and negation may be used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power/ground connections to IC devices and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details.

The present invention is applicable for use with all types of semiconductor IC devices that may be fabricated using CMOS technology. Examples of these IC devices may include programmable read-only memory (PROM) devices, programmable logic arrays (PLA), and other types of memory arrays, such as dynamic random access memory (DRAM), static random access memory; (SRAM), video random access memory (VRAM) and erasable programmable read-only memory (EPROM).

Figure 1:
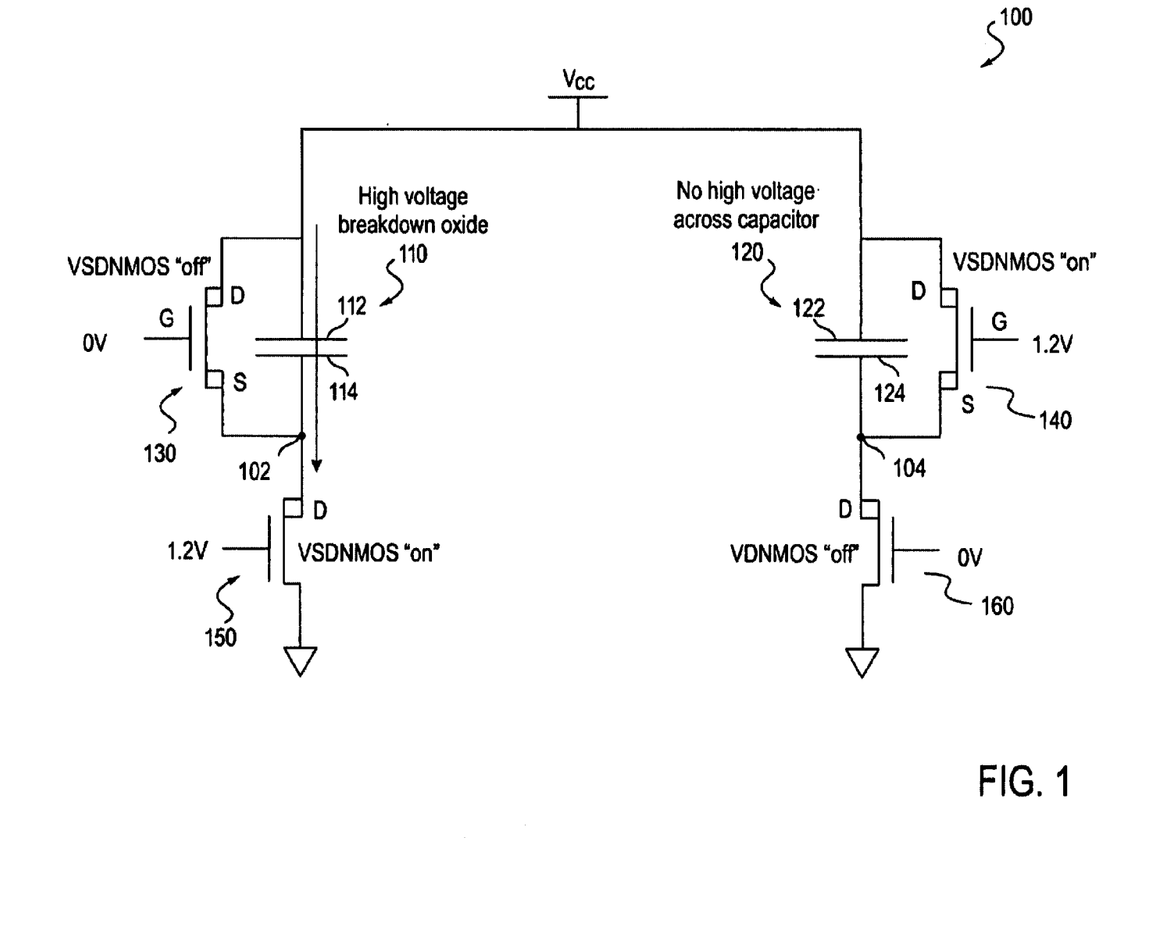
FIG. 1 illustrates an example oxide anti-fuse structure utilizing high voltage transistors with high area density and low programming current requirement according to an example embodiment of the present invention.

Attention now is directed to the drawings and particularly to FIG. 1, in which an example oxide anti-fuse structure 100 for implementation with semiconductor IC devices according to an example embodiment of the present invention is illustrated. As previously discussed, these semiconductor IC devices may be fabricated using CMOS process technology, and are typically designed with a number of redundant component elements that may be used to replace defective components in order to provide a fully functional circuit, and other I/O circuitry (not shown) such as, for example, an address decoder, a control circuit, and a read/write circuit. If the IC device is a memory device, the redundant components may be individual memory rows, memory columns in a redundant memory array used to replace defective memory rows, memory columns in a memory array, or even individual memory cells in a particular row and column of a redundant memory array used to replace defective memory cells in a particular row and column of a memory array. The oxide anti-fuse structure 100 may be implemented as part of a repair circuit (not shown) within the IC device or in connection with a programming circuit (not shown) within the IC device, and may be used in a variety of applications, including selectively enabling or disabling components on an IC device. For example, in a DRAM, anti-fuse structure may be used to enable redundant rows of memory cells used to replace defective rows of memory cells and thereby allowing an otherwise defective memory to be utilized.

As shown in FIG. 1, the oxide anti-fuse structure 100 may comprise oxide anti-fuses 110–120, vertical-source-drain n-channel NMOS (VSDNMOS) transistors 130–140 and vertical-drain-NMOS (VDNMOS) transistors 150–160 arranged to enable the repair of a defective component, i.e., to isolate the defective component and to selectively connect the redundant component in place of the defective component within the IC device. Both the VSDNMOS transistors 130–140 and the VDNMOS transistors 150–160 are high voltage transistors.

Oxide anti-fuses 110 and 120 are connected in parallel to the VSDNMOS transistors 130 and 140 respectively, between a power voltage terminal $V_{cc}$ and intermediate nodes 102 and 104. In particular, the oxide anti-fuse 110 has one of its terminals coupled to the power voltage terminal $V_{cc}$ and its other terminal coupled to an intermediate node 102. Likewise, the oxide anti-fuse 120 also has one of its terminals coupled to the power voltage terminal $V_{cc}$ and its other terminal coupled to an intermediate node 104. The power voltage terminal $V_{cc}$ may supply a high voltage of approximately 4–5 volts, for example.

VSDNMOS transistor 130 has its drain (D) coupled to the power voltage terminal $V_{cc}$, its source (S) coupled to the intermediate node 102, and its gate electrode (G) coupled to receive a program signal (i.e., a programming voltage of, for example, 0 volt or 1.2 volts). Similarly, VSDNMOS 140 has its drain (D) coupled to the power voltage terminal $V_{cc}$, its source (S) coupled to .the intermediate node 104, and its gate electrode (G) coupled to receive a program signal (for example, either 1.2 volts or 0 volt). Each VSDNMOS transistor 130 and 140 can tolerate high voltage on both source (S) and drain (D) sides.

VDNMOS transistors 150 and 160 are coupled between the intermediate nodes 102 and 104 and ground, i.e., connected in series with the oxide anti-fuses 110 and 120 connected in parallel with the VSDNMOS transistors 130 and 140. VDNMOS transistor 150 has its drain (D) coupled to the intermediate node 102, its source (S) coupled to the ground, and its gate electrode (G) coupled to receive a program signal (i.e., a programming voltage of, for example, 1.2 volts or 0 volt). Similarly, VDNMOS 160 has its drain (D) coupled to the intermediate node 104, its source (S) coupled to the ground, and its gate electrode (G) coupled to receive a program signal (for example, either 0 volt or 1.2 volts). Each VDNMOS 150 and 160 can tolerate high voltage only at a drain (D) side.

The oxide anti-fuses 110 and 120 are PMOS gate oxide "blowable" capacitors each of which comprises an oxide (dielectric) layer formed between two conductive plates 112–114 and 122–124. Each of the anti-fuses 110 and 120 presents a high impedance between the conductive plates 112-114 and 122–124 before being programmed or "blown", and a relatively low impedance between conductive plates 112–114 and 122–124 after being programmed.

In order to program the anti-fuse 110, for example, a programming voltage of a sufficient magnitude may be applied across the conductive plates 112 and 114 causing a "breakdown" of the gate oxide layer (not shown) which results in the gate oxide layer (not shown) having a relatively low impedance. For example, a program voltage of approximately 4–5 volts is used to break down the gate oxide anti-fuses 110 and 120. As a result, a much smaller program current can be used to control and activate VDNMOS transistors 150 and 160 and program (or blow) the oxide anti-fuses 110 and 120 when compared to poly fuses which require a large program current to burn the fuses. For instance, a program current of approximately 5 mA can be used to burn (blow) the oxide anti-fuses 110 and 120 in order to relax power delivery routing requirements. This is a significant reduction (about 10× reduction) in the program current of approximately 50 mA required to burn a poly fuse in order to relax the on-chip power delivery routing requirements.

When arranged in the manner described with reference to FIG. 1, the VDNMOS transistors 150 and 160 are used to program a selected oxide anti-fuse 110 or 120. The VSDNMOS transistors 130 and 140 are used to protect non-selected oxide anti-fuse 110 or 120 from stress and breakdown during programming by equalizing the voltage drop across the PMOS gate oxide capacitor. In other words, any selected PMOS gate oxide capacitor (110 or 120) can be selectively programmed (breakdown) to form an "on" state, while any non-selected PMOS gate oxide capacitor (120 or 110) remains in an "off" state.

Figure 2:
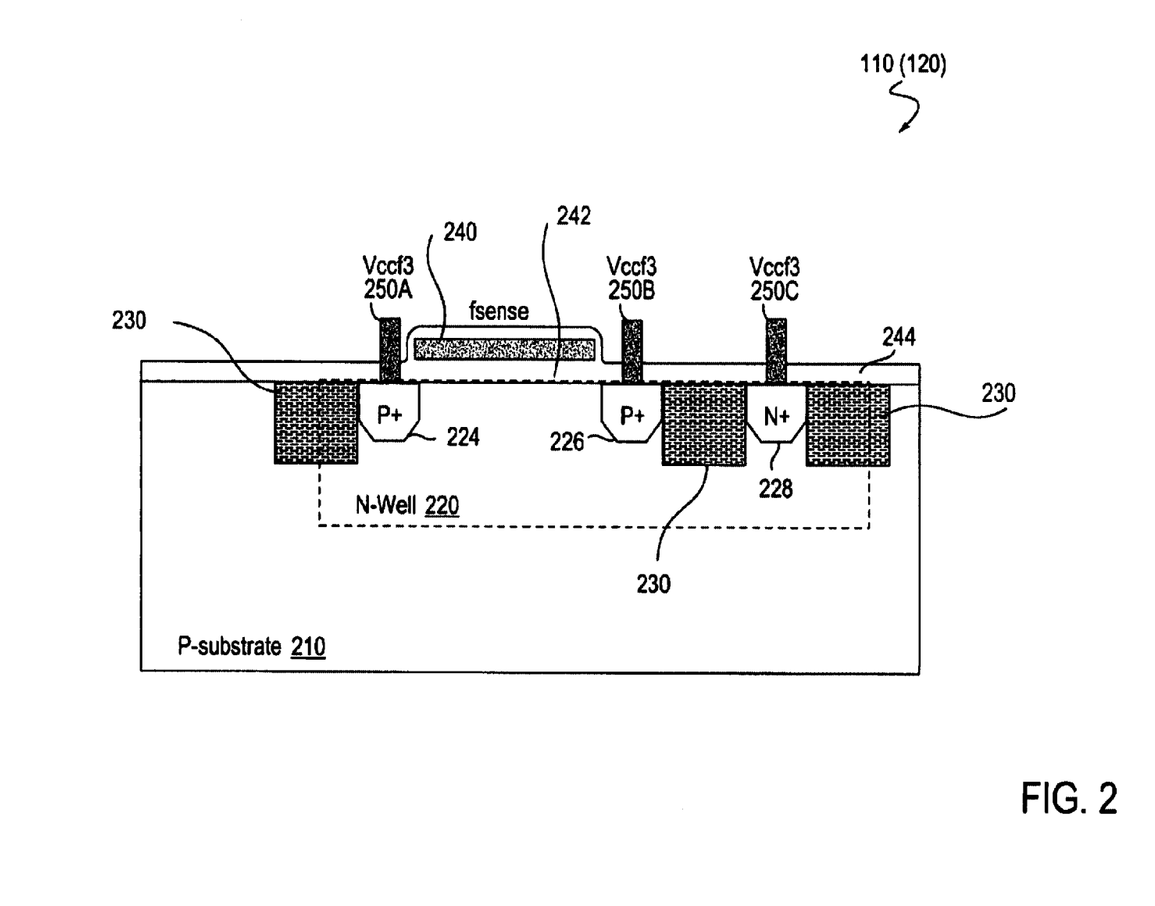
FIG. 2 illustrates a cross-sectional view of an example oxide anti-fuse according to an example embodiment of the present invention.

FIG. 2 illustrates a cross-sectional view of an example oxide anti-fuse 110 or 120 according to an embodiment of the present invention. Since the oxide anti-fuse 110 or 120 serves as a PMOS gate oxide capacitor, the base silicon substrate is a P-type substrate 210. As shown in FIG. 2, the N-well 220 is formed on a P-substrate 210, and shallow trench isolation (STI) regions 230 are formed to provide isolation of various regions formed in the P-substrate 210. The N-well 220 may be formed in the P-substrate 210 through ion implantation and/or diffusion of a dopant or dopants having the N-type conductivity, which is opposite that of the substrate 210. The STI regions 230 may be formed in the N-well 220 through chemical etching and filling therein with an insulation material, such as oxide.

A gate electrode 240 is formed on upper portions of the N-well 220, and may be formed by depositing a P-type polysilicon layer on the upper portions of the N-well 220. Diffusion regions 224 and 226 are formed in the N-well 220 at a portion near the edge of the gate electrode 240 to serve as either a source or drain region (i.e., conductive plates 112–114 and 122–124, shown in FIG. 1) of the PMOS gate oxide capacitor. Such diffusion regions 224 and 226 may be formed by implanting a conductive dopant which is different from the N-well for forming a PMOS gate oxide capacitor. In particular, the diffusion regions 224 and 226 may be heavily doped with P+ dopant(s) to improve contact between a metal layer which forms metal lines 250A–250C and, a gate oxide layer 242 disposed underneath the gate electrode 240. The gate oxide layer 242 may exhibit a thickness of approximately 20–30 Å.

A diffusion region 228 is also formed in the N-well 220, and may also be heavily doped with N+ dopant(s) to establish connection to the N-well 220, via a contact line 250C. Metal lines 250A–250C are formed or bonded to the source/drain regions 224 and 226 and the diffusion region 228 for establishing connection between the source/drain regions 224 and 226 of the PMOS gate oxide capacitor and a power voltage terminal $V_{cc}$. Thereafter, an insulation layer 244 is deposited on the substrate 210 including the above-described PMOS gate oxide capacitor. Such insulation layer 244 may be silicon oxide deposited over the entire surface of the substrate 210, or "grown" using, for example, a rapid thermal processing (RTP) tool. Alternatively, the insulation layer 244 may be silicon nitride or other insulation material that is either grown or deposited on the entire surface of the substrate 210.

Figure 3:
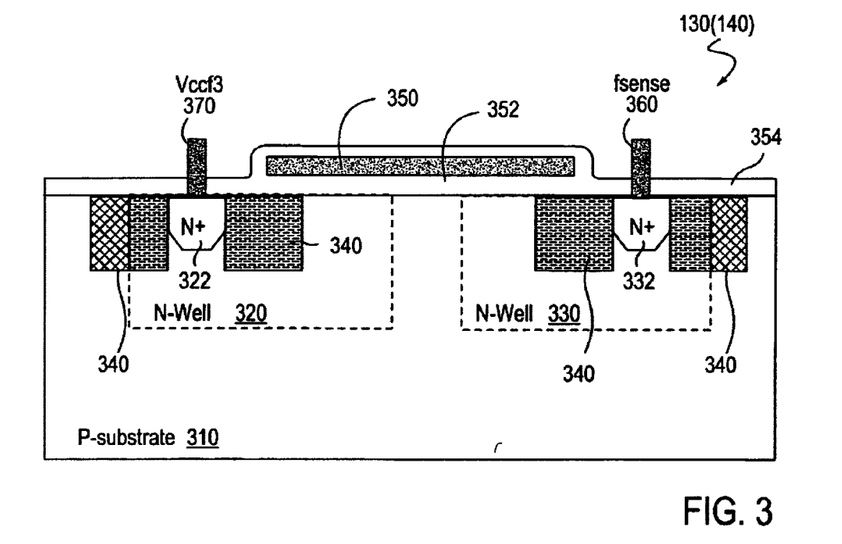
FIG. 3 illustrates a cross-sectional view of an example vertical-source-drain NMOS (VSDNMOS) transistor used to protect non-selected oxide anti-fuses from stress during programming according to an embodiment of the present invention.

FIG. 3 illustrates a cross-sectional view of a vertical-source-drain NMOS (VSDNMOS) transistor 130 or 140 used to protect non-selected oxide anti-fuses (gate oxide capacitors) from stress during programming according to an embodiment of the present invention. As shown in FIG. 3, the N-wells 320 and 330 are formed on a P-substrate 310, and shallow trench isolation (STI) regions 340 are formed to provide isolation of various regions formed in the P-substrate 310. The N-wells 320 and 330 may be formed in the P-substrate 310 through ion implantation and/or diffusion of dopant(s) having the N-type conductivity, which is opposite that of the substrate 310. The STI regions 340 may be formed in the N-wells 320 and 330 through chemical etching and filling therein with an insulation material, such as oxide.

A gate electrode 350 is then formed on upper portions of the N-wells 320 and 330, and may be formed by depositing a N-type polysilicon layer on the upper portions of the N-wells 320 and 330. Diffusion regions 322 and 332 are formed in the N-wells 320 and 330 at a portion near the edge of the gate electrode 350 to serve as a drain region (D) and a source region (S) of the VSDNMOS transistor 130 or 140, respectively. Such diffusion regions 322 and 332 may be heavily doped with N+ dopant(s) to improve contact resistance between a metal layer which forms metal lines 360 and 370 and a gate oxide layer 352 disposed underneath the gate electrode (G) 350. The gate oxide layer 352 may exhibit a thickness of approximately 20–30 Å to offer enhanced programming capability.

Metal line 370 is formed to connect the drain region (D) 322 to a power voltage terminal $V_{cc}$. Similarly, the metal line 360 is formed to connect the source region (S) 332 to a sense terminal fsense. Thereafter, an insulation layer 354 is deposited on the substrate 310 including the above-described VSDNMOS transistor 130 or 140. Such an insulation layer 354 may be silicon oxide deposited over the entire surface of the substrate 310, or "grown" using, for example, a rapid thermal processing (RTP) tool. Alternatively, the insulation layer 354 may be silicon nitride or other insulation material that is either grown or deposited on the entire surface of the substrate 310.

Figure 4:
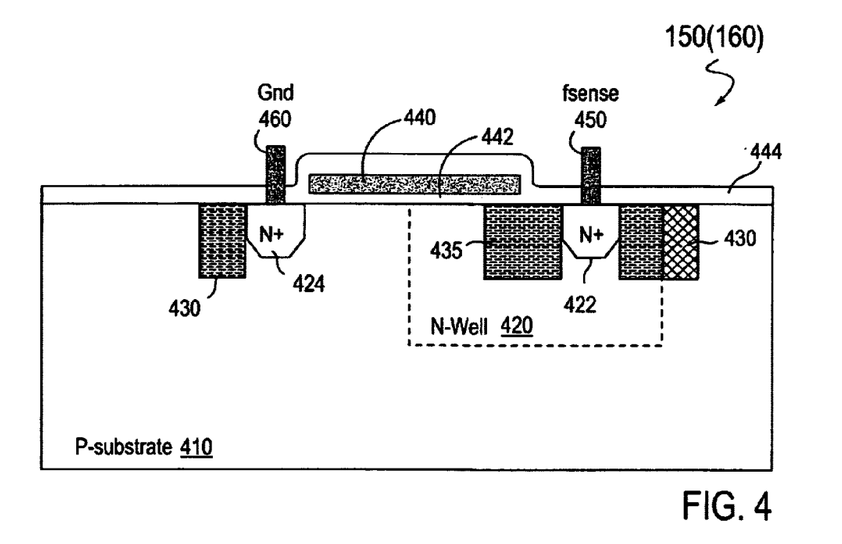
FIG. 4 illustrates a cross-sectional view of an example vertical-drain NMOS (VDNMOS) transistor used to sustain high programming voltage need to breakdown an oxide anti-fuse according to an example embodiment of the present invention.

FIG. 4 illustrates a cross-sectional view of a vertical-drain NMOS (VDNMOS).transistor 150 or 160 used to sustain high programming voltage need to breakdown an oxide anti-fuse (gate oxide capacitor) according to an embodiment of the present invention. As shown in FIG. 4, the N-well 420 is formed on a P-substrate 410, and shallow trench isolation (STI) regions 430 are formed to provide isolation of various regions formed in the P-substrate 410. The N-well 420 may be formed in the P-substrate 410 through ion implantation and/or diffusion of dopant(s) having the N-type conductivity, which is opposite that of the substrate 410. The STI regions 430 may be formed in the N-well 420 through chemical etching and filling therein with an insulation material, such as oxide.

A gate electrode 440 is formed on an upper portion of the N-well 420 and the P-substrate 410, and may be formed by depositing a N-type polysilicon layer on the upper portions of the N-well 420 and the P-substrate 410. Diffusion regions 422 and 424 are formed in the N-well 420 and in the P-substrate 410 at a portion near the edge of the gate electrode 440 to serve as a drain region (D) and a source region (S) of the VDNMOS transistor 150 or 160, respectively. Such diffusion regions 422 and 424 may be heavily doped with N+ dopant(s) to improve contact resistance between a metal layer which forms metal lines 450 and 460 and a gate oxide layer 442 disposed underneath the gate electrode 440. The gate oxide layer 442 may also exhibit a thickness of approximately 20–30 Å to offer enhanced programming capability.

Metal line 450 is formed to connect the drain region (D) 422 to a sense terminal fsense. Similarly, the metal line 460 is formed to connect the source region (S) 424 to a ground terminal. Thereafter, an insulation layer 444 is deposited on the substrate 410 including the above-described VDNMOS transistor 150 or 160. Such an insulation layer 444 may be silicon oxide deposited over the entire surface of the substrate 410, or "grown" using, for example, a rapid thermal processing (RTP) tool. Alternatively, the insulation layer 444 may be silicon nitride or other insulation material that is either grown or deposited on the entire surface of the substrate 410.

Figure 5:
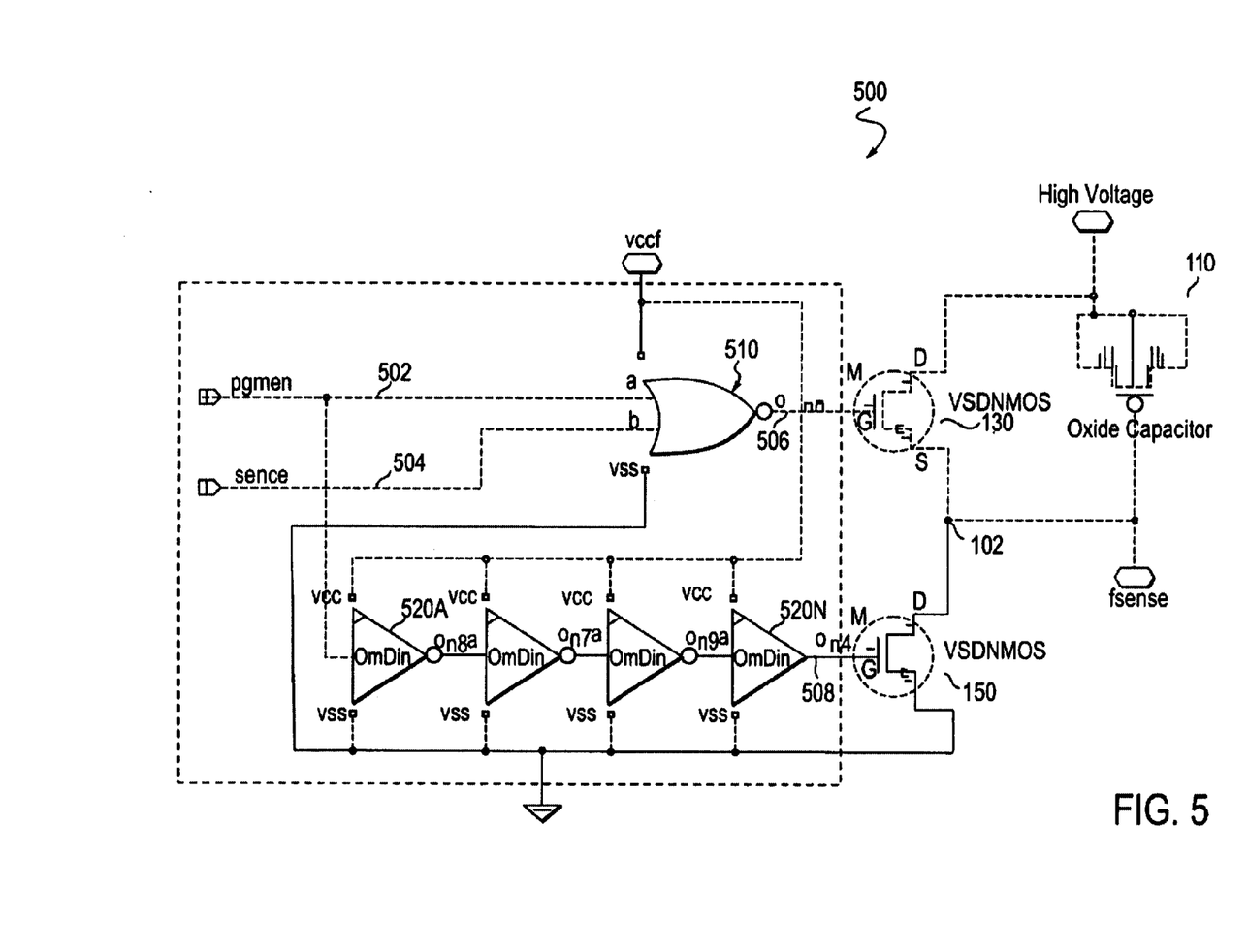
FIG. 5 illustrates a circuit schematic of an example anti-fuse programming circuit according to an example embodiment of the present invention.

FIG. 5 illustrates a circuit schematic of an example anti-fuse programming circuit 500 utilized to program the oxide anti-fuse structure 100 according to an embodiment of the present invention. For the sake of simplicity, only a selected oxide anti-fuse 110 is described herein. As shown in FIG. 5, a logic gate 510, such as a NOR gate, is disposed between a core voltage node Vccf and a ground node Vss, and is arranged to receive a program (pgmen) signal on line 502 and a sense signal on line 504. The program (pgmen) signal may be asserted as an active "high" or "1" during programming, or de-asserted as an active "low" or "0" during sensing. In contrast, the sense signal may be asserted as an active "high" or "1" during sensing, or de-asserted as an active "low" or "0" during programming. The active "high" may be set at 1.2 volts, and the active "low" may be set at 0 volt as shown in FIG. 1.

The NOR gate 510 activates an active "low" or "0" at an output line 506, when the program (pgmen) signal on line 502 is de-asserted as an active "low" or "0" and the sense signal on line 504 is asserted as an active "high" or "1" during sensing. The output of NOR gate 510 on line 506 is coupled to the gate electrode (G) of the VSDNMOS transistor 130. The drain (D) of the VSDNMOS transistor 130 is coupled to a power supply terminal Vcc. The source (S) of the VSDNMOS transistor 130 is coupled to an intermediate node 102.

A series of delay elements, i.e., inverters 520A–520N are also arranged to receive the program (pgmen) signal on line 502. The output of inverters 520A–520N is coupled to the gate electrode (G) of the VDNMOS 150. The drain (D) of the VDNMOS transistor 150 is coupled to the intermediate node 102. The source (S) of the VDNMOS transistor 150 is coupled to a ground node Vss.

The example anti-fuse programming circuit 500 as shown in FIG. 5 may be operated in three states with respect to the oxide anti-fuse 110, i.e., programmed short (to blow the anti-fuse 110 during programming); programmed open (to protect the anti-fuse 110 during programming another selected anti-fuse); and isolation (to electrically isolate the anti-fuse programming circuit 500 from the oxide anti-fuse 110).

Discussion turns first to the "programmed short" operation. When the program (pgmen) signal is asserted as an active "high", line 506 becomes "low" to turn the VSDNMOS transistor 130 "off" while the VDNMOS transistor 150 is "on". With VSDNMOS transistor 130 "off", node 102 is effectively pulled down and sustained by the VDNMOS transistor 150 which causes a large voltage drop across the oxide anti-fuse (oxide capacitor) 110 in order to breakdown the oxide anti-fuse (oxide capacitor) 110.

Turning next to the "programmed open" operation, when the program (pgmen) signal and the sense signal are both de-asserted as an active "low", line 506 becomes "high" to turn the VSDNMOS transistor 130 "on" while the VDNMOS transistor 150 is "off". With VSDNMOS transistor 130 "on" and VDNMOS transistor 150 "off", there is no voltage drop across the oxide anti-fuse (oxide capacitor) 110. The reason for the delay elements 520A–520N is to ensure that the VSDNMOS transistor 130 is turned "on" before the VDNMOS transistor 150 is turned off, so as to guarantee protection to the oxide anti-fuse 110. The oxide anti-fuse 110 is thus protected and remains un-blown or unconductive Turning finally to the "isolation" operation, if an active "low" is applied to the program (pgmen) signal line, and an active "high" is applied to the sense signal line, both the VSDNMOS transistor 130 and the VDNMOS transistor 150 will be turned "off", thus isolating the anti-fuse programming circuit 500 from the oxide anti-fuse 110. Supply of the voltage supply $V_{cc}$ to node 102 (and any replacement circuit connected thereto) is then purely dependent upon whether the oxide anti-fuse 110 has been blown (conductive) or un-blown (unconductive).

An operation truth table with respect to the anti-fuse programming circuit 500 as shown in FIG. 5 can be given as follows.

| Pgmen | Sense | OR | NOR | TR-130 | TR150 | State |
|---|---|---|---|---|---|---|
| 0 | 0 | 0 | 1 | ON | OFF | Pro. Open |
| 0 | 1 | 1 | 0 | OFF | OFF | Isolation |
| 1 | 0 | 1 | 0 | OFF | ON | Prog. Short |
| 1 | 1 | 1 | 0 | OFF | ON | Prog. Short. |

The oxide anti-fuse 110 has one of its terminals coupled to the power supply terminal Vcc and its other terminal coupled to the intermediate node 102. During programming, a high voltage such as 4–5 volts, or the voltage needed to exceed the breakdown voltage of anti-fuse 110 to short the anti-fuse 110, is provided from the power supply terminal Vcc.

When the oxide anti-fuse 110 is programmed (shorted) and the oxide anti-fuse 120 as shown in FIG. 1 is not programmed (left open), the VSDNMOS transistor 140 and the VDNMOS transistor 160 as shown in FIG. 1 are used to protect non-selected oxide anti-fuse 120 from stress during programming. In particular, the VSDNMOS transistor 140 can tolerate high voltage on both the source (S) and drain (D) sides in order to ensure that no high voltage can cross the oxide anti-fuse 120. Likewise, the VDNMOS transistor 160 can also tolerate high voltage at its drain (D). The intermediate node 102 may also serve as a status sense terminal for a sensing circuit (not shown) to sense the status (shorted or left open) of the oxide anti-fuse 110 for subsequent repair of a defective component within an IC device (not shown), i.e., to isolate the defective component and to selectively connect the redundant component in place of the defective component within the IC device.

Figure 6:
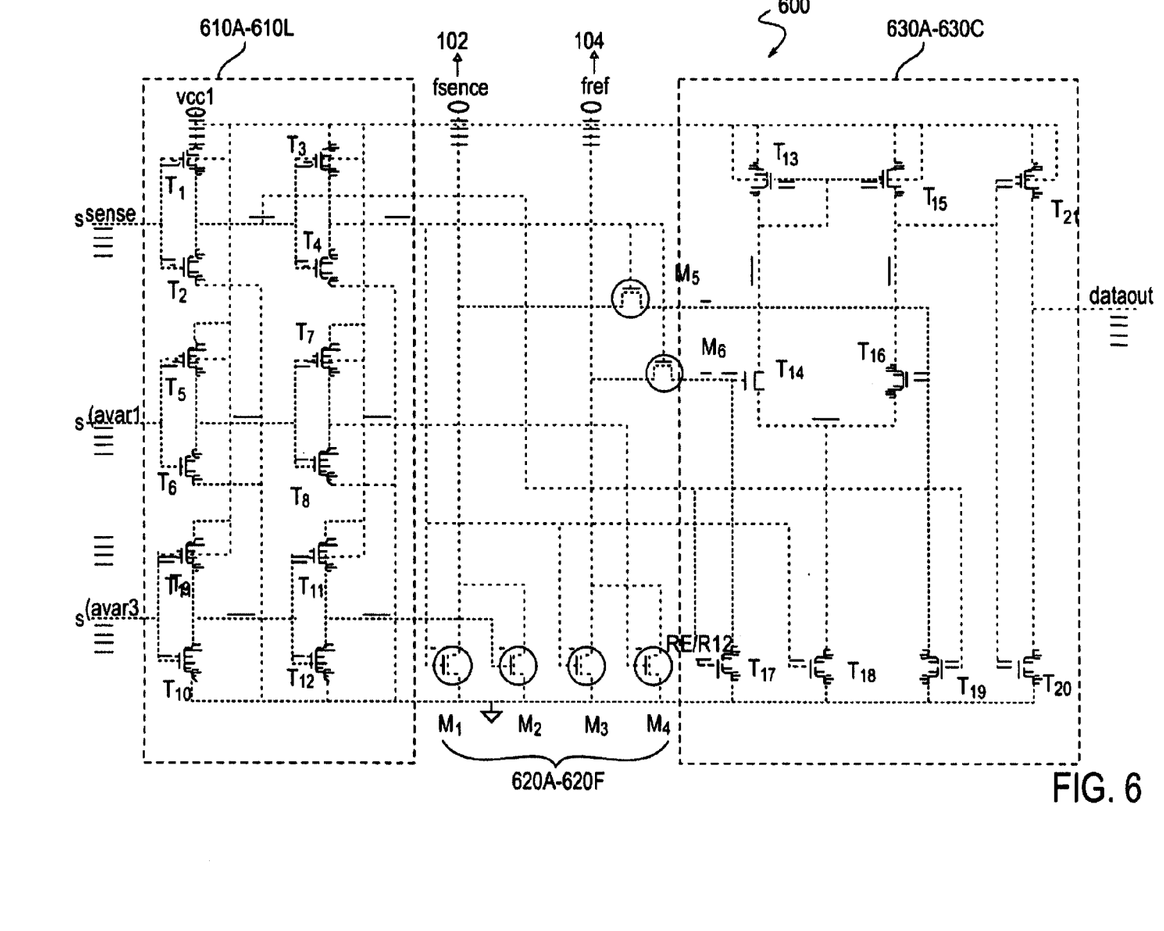
FIG. 6 illustrates a circuit schematic of an example anti-fuse sensing circuit according to an embodiment of the present invention.

Turning now to FIG. 6, a circuit schematic of an example anti-fuse sensing circuit 600 used to sense the status of an oxide anti-fuse 110 according to an embodiment of the present invention is illustrated. Again, for the sake of simplicity, only the sensing operation of a selected oxide anti-fuse 110 is described herein. However, the example sensing circuit 600 may also operate to determine the status of other non-selected oxide anti-fuses such as the oxide anti-fuse 120 shown in FIG. 1, and to test the robustness of the anti-fuse programming. As shown in FIG. 6, the example sensing unit 600 may include a series of upstream inverters 610A–610L used to buffer the input sense signal (sense) and margin modes (favor0 and favor1); a series of pre-amplifiers 620A–620F used to amplify the input sense signal (sense) and margin modes (favor0 and favor1); and a series of downstream differential amplifiers 630A–630C used to improve signal-to-noise ratio.

The upstream inverters 610A–610L may comprise first to twelve NMOS transistors T1, T2, T3, T4, T5, T6, T7, T8, T9, T10, T11 and T12 coupled to buffer the input sense signal (sense) and the 5 margin modes (favor0 and favor1). The pre-amplifiers 620A–620F may comprise first to sixth VDNMOS transistors M1, M2, M3, M4, M5 and M6 used to sense the status of the oxide anti-fuses 110 and 120 during sensing, and to protect the downstream differential amplifiers 630A–630C during programming. The differential amplifiers 630A–630C may comprise NMOS transistors T13, T14, T15, T16, T17, T18, T19, T20 and T21 used to reduce noise and amplify the data output.

A first set of inverters comprised of NMOS transistors T1–T4 may be coupled to receive a sense signal during sensing. A second set of inverters comprised of NMOS transistors T5–T8 may be coupled to receive a margin mode (favor1). A third set of inverters comprised of NMOS transistors T9–T12 may be coupled to receive another margin mode (favor0).

First and third VDNMOS transistors M1 and M3 of the pre-amplifiers 620A–620F are sensing transistors arranged to sense the status of the oxide anti-fuses 110 and 120 in response to an output of the first set of inverters comprised of NMOS transistors T1–T4. Second and fourth VDNMOS transistors M2 and M4 of the pre-amplifiers 620A–620F are margin mode transistors arranged to respond to margin modes (favor1 and favor0) asserted to test pre-burned and post-burned oxide integrity of the oxide anti-fuses 110 and 120. Fifth and sixth VDNMOS transistors M5 and M6 of the pre-amplifiers 620A–620F are protection transistors arranged to protect the downstream differential amplifiers 630A–630C comprised of T13, T14, T15, T16, T17, T18, T19, T20 and T21 during programming.

When programming an oxide anti-fuse 110, for example, the program (pgmen) signal, the sense signal and the margin modes may be set as follows:

pgmen=1,
sense=0,
favor1=0, and
favor0=0.

When sensing an oxide anti-fuse 110, for example, the program (pgmen) signal, the sense signal and the margin modes may be set as follows:

pgmen=0,
sense=1,
favor1=0, and
favor0=0.

Intermediate node 102 "fsense" may be pulled high by the power supply terminal Vcc due to shorting the oxide anti-fuse 110, and the intermediate node 104 may be pulled low by VDNMOS transistor M3 since the oxide anti-fuse 110 is not conducting. Both voltages at node "fsense" and node "fref" are transferred to differential amplifier inputs through transistors M5 and M6 which causes an output pin "dataout" as "1".

When testing the robustness of the anti-fuse programming, the program (pgmen) signal, the sense signal and the margin modes may be set as follows:

(pgmen=0, sense=1, favor1=1, favor0=0),
(pgmen=0, sense=1, favor1=0, favor0=1), and
(pgmen=0, sense=1, favor1=0, favor0=0).

All these three testings should give same data output (dataout), if the oxide anti-fuse 110 is programmed well. However, if the oxide anti-fuse 110 is programmed marginally, the above tests may generate different outputs.

By programming one of either oxide anti-fuse 110 or 120 in the anti-fuse structure 100 shown in FIG. 1 and FIGS. 5–6, the anti-fuse structure 100 can be employed in an anti-fuse bank for programming to respond to specific values of address signals for replacing primary circuit elements, such as row or columns of a DRAM, with redundant circuit elements. In addition, the anti-fuse structure 100 can alternatively be employed in a variety of circuit applications where a programming feature is required. For example, multiple anti-fuse structures may be employed to generate a fuse identification (ID) for an IC device. The fuse ID is a pattern of binary digits which uniquely identify the IC device and can be decoded after the IC device is packaged or integrated onto a circuit board.

Figure 7:
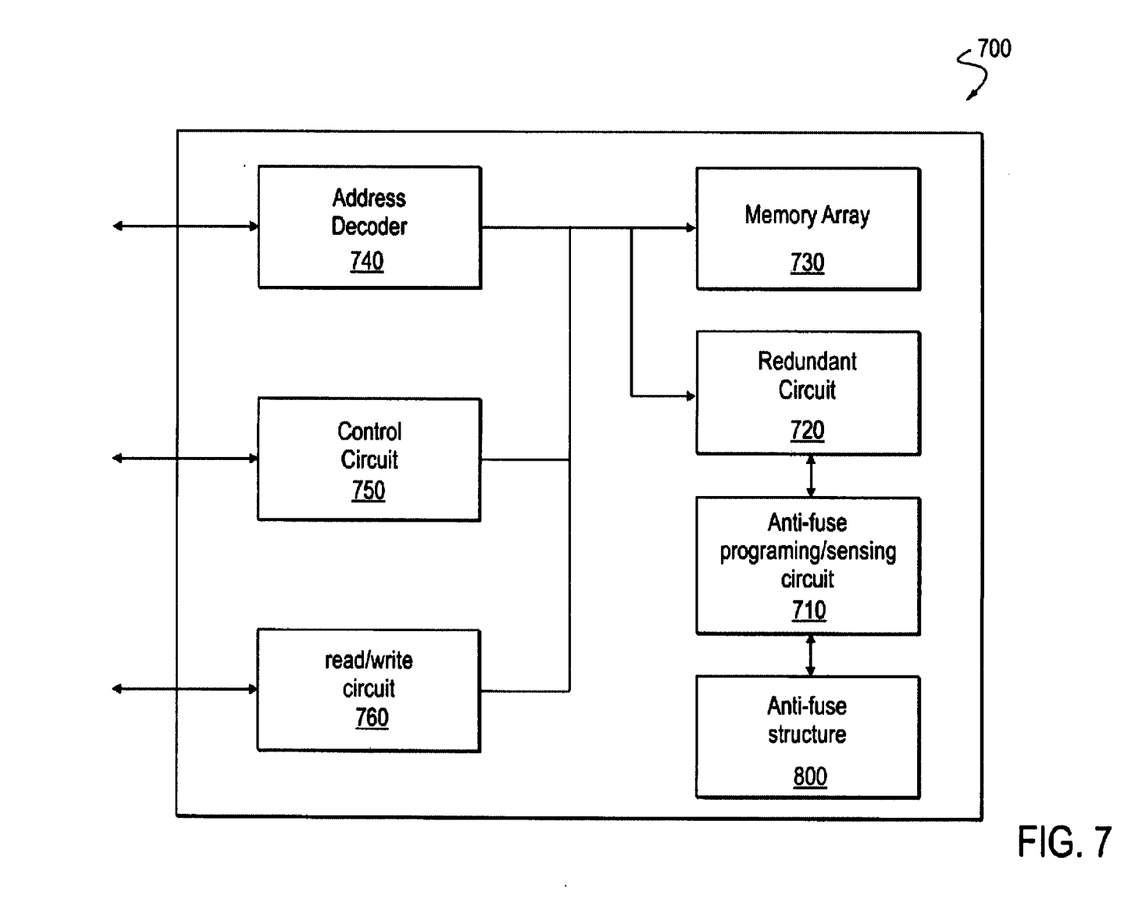
FIG. 7 illustrates an example IC device including an oxide anti-fuse structure according to an embodiment of the present invention.

FIG. 7 illustrates an example IC device including an oxide anti-fuse structure according to an embodiment of the present invention. As shown in FIG. 7, in addition to the oxide anti-fuse structure 100, the IC device 700 includes an anti-fuse programming/sensing circuit 710, a redundant circuit 720, a memory array 730 and other well-known I/O circuitry such as, for example, an address decoder 740, a control circuit 750, and a read/write circuit 760.

The anti-fuse programming/sensing circuit 710 may contain an example programming circuit 500 shown in FIG. 5, and an example sensing circuit 600 shown in FIG. 6. The anti-fuse programming/sensing circuit 710 is typically connected to a plurality of oxide anti-fuse structures, one of which, the oxide anti-fuse 110, is shown schematically in FIG. 1. The anti-fuse programming/sensing circuit 710 may be connected to an enable terminal of the redundant circuit 720 containing a plurality of redundant memory cells that are used to replace defective memory cells in a memory array 730.

The address decoder 740, control circuit 750, and read/write circuitry 760 may be coupled to the memory array 760. In addition, the address decoder 740 may be coupled to an address bus, the control circuit 750 may be coupled to a control bus, and the read/write circuit 760 may be coupled to a data bus. In operation, external circuitry controls operation of the IC device 700 including the programming/sensing circuit 710 to program the desired anti-fuse 110. When the input program (pgmen) signal is asserted "high", the anti-fuse programming/sensing circuit 710 can program (blow) the oxide anti-fuse 110, for example. When the oxide anti-fuse 110 has been blown, the redundant circuit 720 may operate, for example, to replace a row of memory cells in the memory array 730 with redundant memory cells contained within the redundant circuit 720. Operations of the address decoder 740, control circuit 750, and read/write circuitry 760 during read and write data transfer operations are conventional and well-known in the art and, therefore, need not be described in detail herein.

Figure 8:
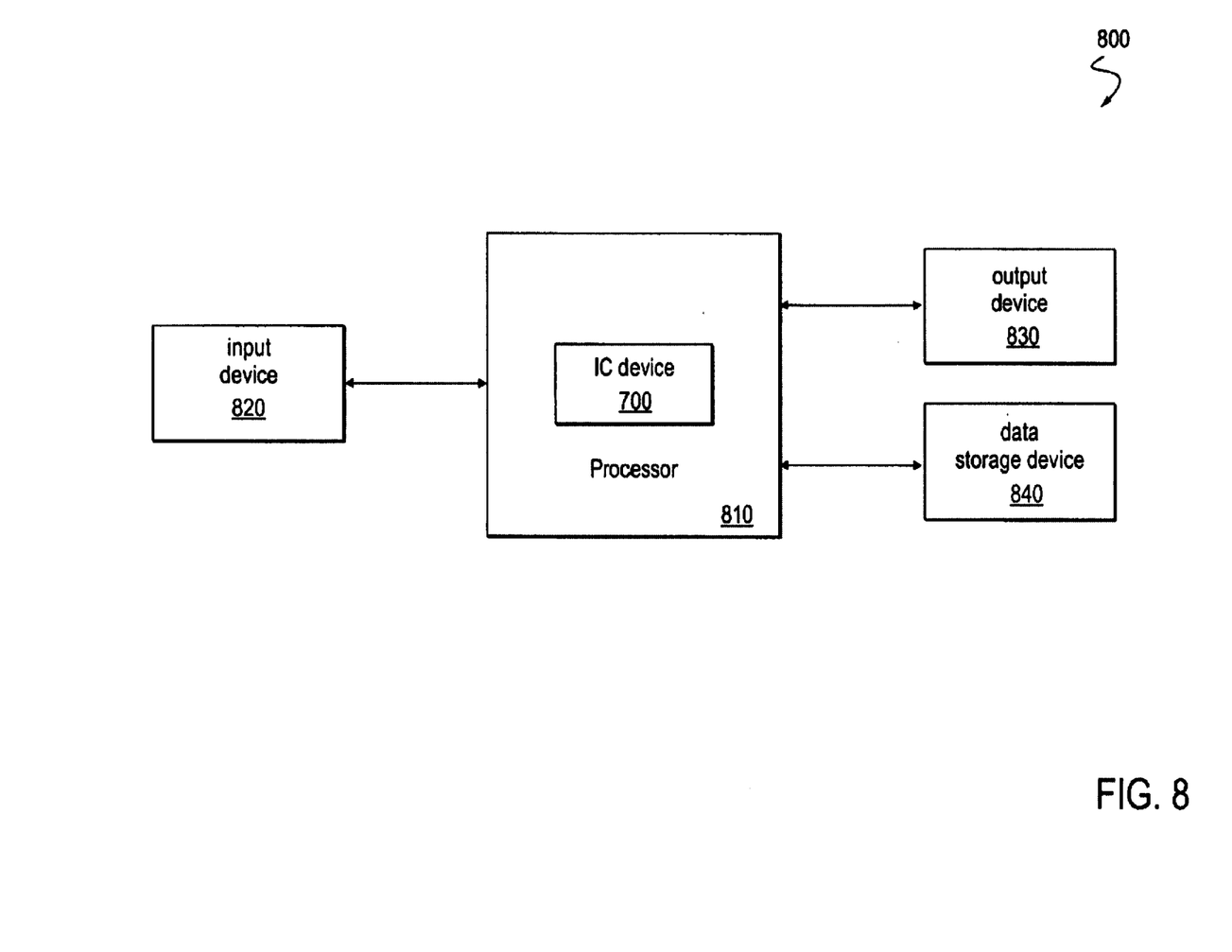
FIG. 8 illustrates an example computer system including the IC device shown in FIG. 7.

FIG. 8 illustrates an example computer system 800 including the IC device 700 shown in FIG. 7. The computer system 800 includes a processor 810 for performing various computing functions, such as executing specific software to perform specific calculations or tasks. In addition, the computer system 800 includes one or more input devices 820, such as a keyboard or a mouse, coupled to the processor 810 to allow an operator to interface with the computer system 800. Typically, the computer system 800 also includes one or more output devices 830 coupled to the processor 810; such output devices typically being a printer or a video terminal. One or more data storage devices 840 are also typically coupled to the processor 810 to store data or retrieve data from external storage media (not shown). Examples of typical storage devices 840 include EPROM, EEPROM, and flash devices; magnetic disks (fixed, floppy, and removable); other magnetic media such as tape cassettes; and optical media such as CD-ROM disks. The processor 810 is typically coupled to the IC device 700 through a control bus, a data bus, and an address bus to provide for writing data to and reading data from the IC device 700.

As described from the foregoing, the present invention advantageously provides an anti-fuse structure for implementation within IC devices formed using standard CMOS processes that has a higher area density and requires a much smaller programming current when compared to poly fuses.

While there have been illustrated and described what are considered to be example embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. For example, the anti-fuse can be implemented using a different dielectric layer, such as nitride, which can be "blown" at a voltage lower than a programming voltage. Similarly, the anti-fuse programming circuit 500 and the anti-fuse sensing circuit 600 can be implemented with a different arrangement of delay elements and logic gates, such as AND, NAND, OR and XOR gates. Therefore, it is intended that the present invention not be limited to the various example embodiments disclosed, but that the present invention includes all embodiments falling within the scope of the appended claims.

What is claimed is:

1. An anti-fuse structure for an IC device, comprising:
   an anti-fuse operable in a normal "open" state and a programmed "shorted" state, and having a first electrode coupled to a first power supply, and a second electrode coupled to an intermediate node;
   a first transistor arranged in parallel with the anti-fuse, and having a drain coupled to the first power supply, a source coupled to the intermediate node, and a gate electrode coupled to respond to a program signal to program the anti-fuse; and
   a second transistor arranged in series with the anti-fuse and the first transistor, and having a drain coupled to the intermediate node, a source coupled to a second power supply, and a gate electrode coupled to respond to the program signal to sustain a voltage needed to program the anti-fuse.

2. An anti-fuse structure as claimed in claim 1, wherein the first power supply is the voltage needed to program the anti-fuse, the second power supply is ground, the first transistor is a vertical-source-drain NMOS transistor operable to tolerate high voltage at both source and drain side, and the second transistor is a vertical-drain NMOS transistor operable to tolerate high voltage at the drain side.

3. An anti-fuse structure as claimed in claim 1, wherein the anti-fuse is a PMOS gate oxide capacitor comprised of an oxide layer exhibiting a high impedance before being programmed, and a low impedance after being programmed.

4. An anti-fuse structure as claimed in claim 1, wherein the anti-fuse is formed in a N-well of a P-substrate, the anti-fuse comprising:
   source/drain regions formed and spaced-apart in the N-well, and heavily doped with P+ dopant(s);
   a diffusion region formed in the N-well, and heavily doped with N+ dopant(s);
   shallow trench isolation (STI) regions formed in the N-well to provide isolation between the diffusion region and the source/drain regions;
   a gate electrode formed over the source and drain regions, and isolated from the source and drain regions by an oxide layer;
   metal lines bonded to the source/drain regions and the diffusion region, for coupling the source/drain regions to the first power voltage; and
   an insulation layer deposited on the P-substrate including the N-well.

5. An anti-fuse structure as claimed in claim 1, further comprising:

a second anti-fuse operable in a normal "open" state and a programmed "shorted" state, and having a first electrode coupled to the first power supply, and a second electrode coupled to a second intermediate node;
a third transistor arranged in parallel with the second anti-fuse, and having a drain coupled to the first power supply, a source coupled to the second intermediate node, and a gate electrode coupled to respond to a second program signal to protect the second anti-fuse from stress during programming; and
a fourth transistor arranged in series with the second anti-fuse and the third transistor, and having a drain coupled to the second intermediate node, a source coupled to the second power supply, and a gate electrode coupled to respond the second program signal to sustain a voltage needed to program the second anti-fuse.

6. An anti-fuse structure as claimed in claim 5, wherein the first power supply is the voltage needed to program the anti-fuse, the second power supply is ground, the first and third transistors are vertical-source-drain NMOS transistors operable to tolerate high voltage at both source and drain side, and the second and fourth transistors are vertical-drain NMOS transistors operable to tolerate high voltage at the drain side.

7. An anti-fuse structure as claimed in claim 6, wherein the first and second anti-fuses are PMOS gate oxide capacitors each of which is comprised of an oxide layer s exhibiting a high impedance before being programmed, and a low impedance after being programmed.

8. An anti-fuse structure as claimed in claim 1, further comprising an anti-fuse program circuit arranged to program the anti-fuse through application of the program signal to the first and second transistors, the anti-fuse program circuit comprising:
   a logic gate disposed between a core voltage node and a ground node, and arranged to receive the program signal and a sense signal, and activate an active "low" state at an output to disable operation of the first transistor; and
   a series of delay elements arranged to receive the program signal, and activate an active "high" state at an output to enable operation of the second transistor.

9. An anti-fuse structure as claimed in claim 6, further comprising an anti-fuse sense circuit arranged to sense the state of the anti-fuse for subsequently exchanging a defective circuit element in the IC device with a redundant circuit element.

10. An IC device, comprising:
    an anti-fuse structure comprising at least first and second anti-fuses each coupled to a first power supply; first and second vertical-source-drain NMOS transistors arranged in parallel with the first and second anti-fuses with gate electrodes coupled to respond to first and second program voltages; and first and second vertical-drain NMOS transistors arranged in series with the vertical-source-drain NMOS transistors with gate electrodes coupled to response to the first and second program voltages, and sources coupled to a second power supply; and
    an anti-fuse program circuit having first and second input terminals coupled to receive the first and second program voltages respectively, and having first and second output terminals coupled to the gate electrodes of the first and second vertical-source-drain NMOS transistors and the gate electrodes of the first and second vertical-drain NMOS transistors respectively, the anti-fuse program circuit operable to program a selected one of the anti-fuses through application of the first and second program voltages.

11. An IC device as claimed in claim 10, wherein the first power supply is the voltage needed to program the anti-fuse, the second power supply is ground, the first and second vertical-source-drain NMOS transistors tolerate high voltage at both source and drain side, and the first and second vertical-drain NMOS transistors tolerate high voltage at the drain side.

12. An IC device as claimed in claim 10, wherein the anti-fuses are PMOS gate oxide capacitors each of which is comprised of an oxide layer formed between two conductive plate electrodes exhibiting a high impedance before being programmed, and a low impedance after being programmed.

13. An IC device as claimed in claim 10, wherein each of the anti-fuses is formed in a N-well of a P-substrate, and comprising:
    source/drain regions formed and spaced-apart in the N-well, and heavily doped with P+ dopant(s);
    a diffusion region formed in the N-well, and heavily doped with N+ dopant(s);
    shallow trench isolation (STI) regions formed in the N-well to provide isolation between the diffusion region and the source/drain regions;
    a gate electrode formed over the source and drain regions, and isolated from the source and drain regions by an oxide layer;
    metal lines bonded to the source/drain regions and the diffusion region, for coupling the source/drain regions to the first power voltage; and
    an insulation layer deposited on the P-substrate including the N-well.

14. An IC device as claimed in claim 10, wherein the anti-fuse program circuit comprises program units arranged to program one of the anti-fuses, each program unit comprising:
    a logic gate disposed between a core voltage node and a ground node, and arranged to receive the first and second program voltages, and activate an active "low" state at an output to disable operation of a selected one of the first and second vertical-source-drain NMOS transistors; and
    a series of delay elements arranged to receive one of the first and second program voltages, and activate an active "high" state at an output to enable operation of a selected one of the first and second vertical-drain NMOS transistors.

15. An IC device as claimed in claim 10, further comprising an anti-fuse sense circuit arranged to sense the state of a selected one of the anti-fuses for subsequently exchanging a defective component in the IC device with a redundant component.

16. An IC device as claimed in claim 15, further comprising:
    an address decoder coupled to an address bus;
    a control circuit coupled to an control bus;
    a read/write circuit coupled to a data bus;
    a memory array coupled to the address decoder, the control circuit, and the read/write circuit, and having a plurality of memory cells; and
    a redundant circuit coupled to the anti-fuse program circuit and the anti-fuse sense circuit, the redundant circuit having a plurality of redundant memory cells used to replace defective memory cells in the memory array, and replacing one or more selected defective memory cells in the memory array with one or more redundant memory cells in response to the program status of the first and second anti-fuses.

17. A computer system, comprising:
    a data input device;
    a data output device; and
    a processor coupled to the data input device and the data output device, the processor including an IC device that includes an anti-fuse structure used to respond to program voltages for replacing primary circuit element with redundant circuit element,
    wherein the anti-fuse structure comprises at least one anti-fuse coupled to a first power supply; a vertical-source-drain NMOS transistor arranged in parallel with the anti-fuse with a gate electrode coupled to respond to the program voltages; and a vertical-drain NMOS transistor arranged in series with the vertical-source-drain NMOS transistor with a gate electrode coupled to response to the program voltages, and a source coupled to a second power supply.

18. A computer system as claimed in claim 17, further comprising:
    an anti-fuse program circuit having first and second input terminals coupled to receive first and second program voltages respectively, and having first and second output terminals coupled to the gate electrode of the vertical-source-drain NMOS transistor and the gate electrode of the vertical-drain NMOS transistor, the anti-fuse program circuit operable to program the anti-fuse through application of the first and second program voltages.

19. A computer system as claimed in claim 18, wherein the first power supply is the voltage needed to program the anti-fuse, the second power supply is ground, the vertical-source-drain NMOS transistor is operable to tolerate high voltage at both source and drain side, and the vertical-drain NMOS transistor is operable to tolerate high voltage at the drain side.

20. A computer system as claimed in claim 18, wherein the anti-fuse is a PMOS gate oxide capacitor comprised of an oxide layer exhibiting a high impedance before being programmed, and a low impedance after being programmed.

21. A computer system as claimed in claim 18, wherein the anti-fuse is formed in a N-well of a P-substrate, and comprising:
    source/drain regions formed and spaced-apart in the N-well, and heavily doped with P+ dopant(s);
    a diffusion region formed in the N-well, and heavily doped with N+dopant(s);
    shallow trench isolation (STI) regions formed in the N-well to provide isolation between the diffusion region and the source/drain regions;
    a gate electrode formed over the source and drain regions, and isolated from the source and drain regions by an oxide layer;
    metal lines bonded to the source/drain regions and the diffusion region, for coupling the source/drain regions to the first power voltage; and
    an insulation layer deposited on the P-substrate including the N-well.

22. A computer system as claimed in claim 18, wherein the anti-fuse program circuit comprises:
    a logic gate disposed between a core voltage node and a ground node, and arranged to receive the first and second program voltages, and activate an active "low" state at an output to disable operation of the vertical-source-drain NMOS transistor; and a series of delay elements arranged to receive one of the first and second program voltages, and activate an active "high" state at an output to enable operation of the vertical-drain NMOS transistor.

23. A computer system as claimed in claim 18, further comprising an anti-fuse sense circuit arranged to sense the state of the anti-fuse for exchanging a defective circuit element in the IC device with a redundant circuit element.

24. An IC device, comprising: an anti-fuse structure comprising at least first and second anti-fuses each coupled to a first power supply; a pair of first transistors arranged in parallel with the first and second anti-fuses with gate electrodes coupled to respond to first and second program voltages; and a pair of second transistors arranged in series with the pair of first transistors with gate electrodes coupled to response to the first and second program voltages, and sources coupled to a second power supply; and an anti-fuse program circuit operable to program a selected one of the anti-fuses through application of the first and second program voltages.

25. An IC device as claimed in claim 24, wherein the first power supply is the voltage needed to program the anti-fuse, the second power supply is ground, the pair of first transistors are vertical-source-drain NMOS transistors operable to tolerate high voltage at both source and drain side, and the pair of second transistors are vertical-drain NMOS transistors operable to tolerate high voltage at the drain side.

26. An IC device as claimed in claim 24, wherein the anti-fuses are PMOS gate oxide capacitors each of which is comprised of an oxide layer formed between two conductive plate electrodes exhibiting a high impedance before being programmed, and a low impedance after being programmed.

27. An IC device as claimed in claim 24, wherein each of the anti-fuses is formed in a N-well of a P-substrate, and comprising:

source/drain regions formed and spaced-apart in the N-well, and heavily doped with P+ dopant(s);

a diffusion region formed in the N-well, and heavily doped with N+ dopant(s);

shallow trench isolation (STI) regions formed in the N-well to provide isolation between the diffusion region and the source/drain regions;

a gate electrode formed over the source and drain regions, and isolated from the source and drain regions by an oxide layer;

metal lines bonded to the source/drain regions and the diffusion region, for coupling the source/drain regions to the first power voltage; and an insulation layer deposited on the P-substrate including the N-well.

28. An IC device as claimed in claim 24, wherein the anti-fuse program circuit comprises program units arranged to program one of the anti-fuses, each program unit comprising:

a logic gate disposed between a core voltage node and a ground node, and arranged to receive the first and second program voltages, and activate an active "low" state at an output to disable operation of a selected one of the first transistors; and a series of delay elements arranged to receive one of the first and second program voltages, and activate an active "high" state at an output to enable operation of a selected one of the second transistors.

29. An IC device as claimed in claim 24, further comprising an anti-fuse sense circuit arranged to sense the state of a selected one of the anti-fuses for subsequently exchanging a defective component in the IC device with a redundant component.

30. An IC device as claimed in claim 24, further comprising:

an address decoder coupled to an address bus;

a control circuit coupled to an control bus;

a read/write circuit coupled to a data bus;

a memory array coupled to the address decoder, the control circuit, and the read/write circuit, and having a plurality of memory cells; and a redundant circuit coupled to the anti-fuse program circuit and the anti-fuse sense circuit, the redundant circuit having a plurality of redundant memory cells used to replace defective memory cells in the memory array, and replacing one or more selected defective memory cells in the memory array with one or more redundant memory cells in response to the program status of the first and second anti-fuses.

31. A system, comprising:

a data input device;

a data output device; and a microchip coupled to the data input device and the data output device, the microchip including an IC device that includes an anti-fuse structure used to respond to program voltages for replacing primary circuit element with redundant circuit element, wherein the anti-fuse structure comprises at least one anti-fuse coupled to a first power supply; a first transistor arranged in parallel with the anti-fuse, coupled to the first power supply with a gate electrode coupled to respond to the program voltages; and a second transistor arranged in series with the first transistor, coupled to a second power supply with a gate electrode coupled to response to the program voltages.

32. A system as claimed in claim 31, further comprising:

an anti-fuse program circuit having first and second input terminals coupled to receive first and second program voltages respectively, and having first and second output terminals coupled to the gate electrodes of the first and second transistors, the anti-fuse program circuit operable to program the anti-fuse through application of the first and second program voltages.

33. A system as claimed in claim 32, wherein the first power supply is the voltage needed to program the anti-fuse, the second power supply is ground, the first transistor is a vertical-source-drain NMOS transistor operable to tolerate high voltage at both source and drain side, and the second transistor is a vertical-drain NMOS transistor operable to tolerate high voltage at the drain side.

34. A system as claimed in claim 32, wherein the anti-fuse is a PMOS gate oxide capacitor comprised of an oxide layer exhibiting a high impedance before being programmed, and a low impedance after being programmed.

35. A system as claimed in claim 32, wherein the anti-fuse is formed in a N-well of a P-substrate, and comprising:

source/drain regions formed and spaced-apart in the N-well, and heavily doped with P+ dopant(s);

a diffusion region formed in the N-well, and heavily doped with N+dopant(s);

shallow trench isolation (STI) regions formed in the N-well to provide isolation between the diffusion region and the source/drain regions;

a gate electrode formed over the source and drain regions, and isolated from the source and drain regions by an oxide layer;

metal lines bonded to the source/drain regions and the diffusion region, for coupling the source/drain regions to the first power voltage; and an insulation layer deposited on the P-substrate including the N-well.

36. A system as claimed in claim 32, wherein the anti-fuse program circuit comprises:

a logic gate disposed between a core voltage node and a ground node, and arranged to receive the first and second program voltages, and activate an active "low" state at an output to disable operation of the first transistor; and a series of delay elements arranged to receive one of the first and second program voltages, and activate an active "high" state at an output to enable operation of the second transistor.

37. A system as claimed in claim 32, further comprising an anti-fuse sense circuit arranged to sense the state of the anti-fuse for exchanging a defective circuit element in the IC device with a redundant circuit element.

* * * * *